PRINTED CIRCUIT SLIDE-SWITCH CONNECTOR WITH
RESILIENT ELECTRICAL CONTACTS

Filed July 26, 1965

INVENTOR
ROBERT L. DE VRIES

BY Q. C. Smith
ATTORNEY 3,344,243
Patented Sept. 26, 1967

3,344,243

PRINTED CIRCUIT SLIDE-SWITCH CONNECTOR WITH RESILIENT ELECTRICAL CONTACTS

Robert L. De Vries, Palo Alto, Calif., assignor to Hewlett-Packard Company, Palo Alto, Calif., a corporation of California Filed July 26, 1965, Ser. No. 474,789
6 Claims. (Cl. 200—16)

ABSTRACT OF THE DISCLOSURE

A plurality of resilient electrical contacts mounted along the opposite walls of a slot in a dielectric member to firmly engage a printed circuit board inserted into the slot while permitting the printed circuit board to be displaced along the length of the slot to perform a switching function.

This invention relates to slide-switch connectors for use with circuit boards.

Typically, circuit board connectors are of the plug-in type. This type of connector is not always well suited for the minimum space requirements of modern instrumentation packaging. Furthermore, since a circuit board has to be removed from the plug-in connector and then reinserted to alter its position in the connector, the plug-in connector is not well suited for use as a switch.

It is the principal object of this invention to provide a slide-switch connector for use with circuit boards, such that the circuit board may be longitudinally displaced along the connector to perform a switching function.

Another object of this invention is to provide a circuit board connector which facilitates ease of insertion and ease of removal of the circuit board.

In accordance with the illustrated embodiment of this invention, there is provided a connector comprising a slotted dielectric member having a plurality of resilient electrical contacts mounted in recesses in the opposite walls of the slot for making a pressure contact with the electrical terminals of a printed circuit board which is displaced longitudinally along the slot.

Figure 1:
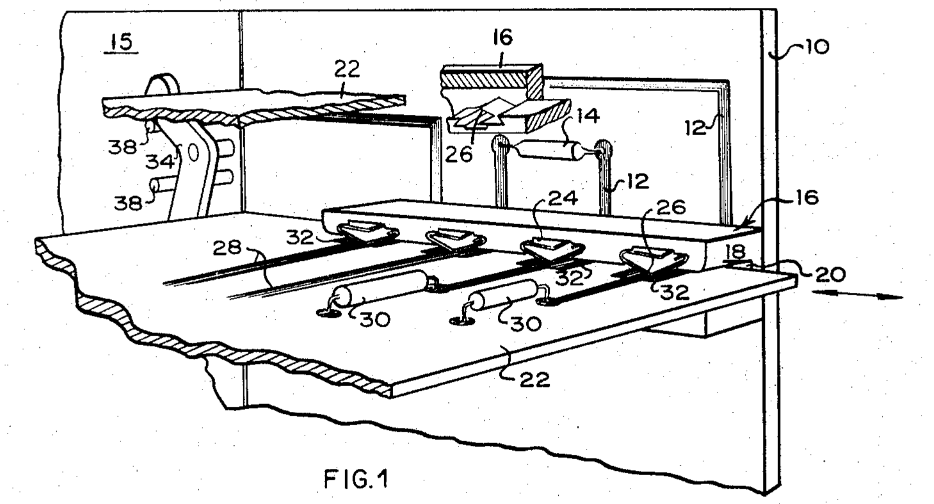
Figure 2:
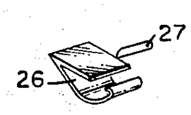

Other and incidental objects of this invention will become apparent from a reading of this specification and an inspection of the accompanying drawing in which FIGURE 1 shows one embodiment of the slide switch connector according to this invention and FIGURE 2 shows in detail one of the resilient electrical contacts of FIGURE 1.

Referring now to the drawing, there is shown a printed circuit board 10 having conductors 12 and circuit components 14 thereon to form an electrical circuit. This printed circuit board 10 is mounted on the chassis 15 of an electrical instrument. A plurality of slide switch connectors 16 are mounted adjacent to one another on the printed circuit board 10. Each slide switch connector 16 comprises a dielectric member 18 having a longitudinal slot 20 therein for receiving one edge of a printed circuit board 22. A plurality of recesses 24 are located in the opposite walls of the slot 20, and a plurality of resilient electrical contacts 26 are fixedly positioned in these recesses. The generally V-shaped face of each resilient electrical contact 26 protrudes into the slot 20 for providing a sliding connection to the edge of a printed circuit board 22 when it is displaced longitudinally along the slot. As the edge of the printed circuit board 22 is moved across the V-shaped face of a resilient electrical contact 26, the resilient electrical contact is forced back into the corresponding recess 24, causing it to make a pressure contact with the edge of the printed circuit board 22. This pressure contact is sufficient to hold the printed circuit board 22 firmly in the connector 16 but does not impede further displacement of the printed circuit board 22 in either direction along the slot 20. Each of the resilient electrical contacts 26 also includes a stem-like portion 27 which extends through a hole in the base of the dielectric member 18 to make electrical contact with a selected portion of the circuit on printed circuit board 10.

The printed circuit board 22 for each slide switch connector 16 has an electrical circuit thereon comprising conductors 28 and circuit components 30. Selected portions of this electrical circuit are connected to a plurality of electrical contact terminals 32 which are spaced along one or more edges of the printed circuit board 22 so as to be aligned with selected electrical contacts 26 when an edge of the printed circuit board is inserted in the connector 16 to the corresponding position. Thus, with appropriate alignment of the electrical contact terminals 32 along the edge of the printed circuit board 22 it is possible to perform a switching function by simply altering the position of the printed circuit board in the connector 16.

A detent mechanism comprising lever 34 is rotatably mounted on the chassis 15 for engaging an end of each of the printed circuit boards 22. Stops 38 for the lever 34 are also mounted on the chassis 15 to stop the longitudinal displacement of the printed circuit board 22 when it is inserted to the actuated position in the connector 16 for which selected electrical contacts 26 and contact terminals 32 are properly aligned. The lever 34 is formed so that when one of the printed circuits boards 22 is inserted into the actuated position in its connector 16, the other printed circuit board 22 is automatically forced back to a deactivated position in its connector 16. It should be noted that a detent mechanism could be constructed to handle more than two printed circuit boards 22 and to provide different actuated positions for each printed circuit board.

I claim:

1. A connector for electrically connecting a contact terminal of a circuit board to an electrical circuit, said connector comprising:
   - a dielectric member having a slot therein for receiving the circuit board, said slot having a pair of oppositely facing walls and having at least one open end for receiving the circuit board; and
   - a resilient contact element fixedly mounted on one of said oppositely facing walls and protruding into said slot for engaging the circuit board when it is inserted into said slot from said one end thereof, said resilient contact element being compressed by the circuit board for permitting sliding displacement of the circuit board along the length of said slot to bring said resilient contact element into contact with the contact terminal of the circuit board.

2. Apparatus as in claim 1 for electrically connecting additional contact terminals of the circuit board to an electrical circuit, said apparatus comprising:
   - additional resilient contact elements fixedly mounted on at least said one of said oppositely facing walls and protruding into said slot for engaging the circuit board when it is inserted into said slot from said one end thereof, said additional resilient contact elements being compressed by the circuit board for permitting sliding displacement of the circuit board along the length of said slot to bring said additional resilient contact elements into contact with the additional contact terminals of the circuit board.

3. Apparatus as in claim 2 wherein said additional resilient contact elements are fixedly mounted on both of said oppositely facing walls of said slot.

4. Apparatus as in claim 3 wherein:

said oppositely facing walls of said slot have a plurality of recesses therein; and said resilient contact elements are fixedly mounted in said recesses and protrude into said slot for engaging the circuit board when it is inserted into said slot from said one end thereof, said resilient contact elements being compressed by the circuit board for permitting sliding displacement of the circuit board along the length of said slot to bring said resilient contact elements into contact with the contact terminals of the circuit board.

5. A connector as in claim 4 wherein:

said dielectric member is supported on another circuit board, said other circuit board supporting a circuit; and selected ones of said resilient contact elements include a portion for contacting a selected portion of the circuit supported on said other circuit board.

6. A connector as in claim 4 for electrically connecting selected contact terminals of the circuit board to an electrical circuit while electrically disconnecting selected contact terminals of a further circuit board from an electrical circuit, said connector comprising:

another dielectric member having a slot therein for receiving the further circuit board, said slot having a pair of oppositely facing walls and having at least one end for receiving the further circuit board, said oppositely facing walls of said slot having a plurality of recesses therein;

other resilient contact elements fixedly mounted in said last-mentioned plurality of recesses and protruding into said last-mentioned slot for engaging the further circuit board when it is inserted into said last-mentioned slot from said one end thereof, said other resilient contact elements being compressed by the further circuit board for permitting sliding displacement of the further circuit board along the length of said last-mentioned slot to bring said other resilient contact elements into contact with the contact terminals of the further circuit board; and means for engaging the circuit boards when they are inserted into said slots and for displacing one of the circuit boards in one direction back along the length of one of the slots to disengage selected contact terminals of that circuit board from selected resilient contact elements protruding into that slot when the other circuit board is forced against said means in the opposite direction along the length of the other slot to engage selected contact terminals of that other circuit board with selected resilient contact elements protruding into that other slot.

References Cited

UNITED STATES PATENTS

| | | | |
|---|---|---|---|
| 3,008,113 | 11/1961 | Johnson | 339—17 |
| 3,234,499 | 2/1966 | Paholek et al. | 339—176 |
| 3,246,208 | 4/1966 | Lex et al. | 317—101 |

ROBERT K. SCHAEFER, *Primary Examiner.*

J. R. SCOTT, *Assistant Examiner.*